United States Patent [19]
Lee et al.

[11] Patent Number: 5,579,987
[45] Date of Patent: Dec. 3, 1996

[54] SEMICONDUCTOR PACKAGE VERTICAL MOUNTING DEVICE AND MOUNTING METHOD

[75] Inventors: Kug S. Lee, Kyungki-do; Khee Park, Seoul, both of Rep. of Korea

[73] Assignee: Samsung Electronics Co., Ltd., Suweon, Rep. of Korea

[21] Appl. No.: 13,348

[22] Filed: Feb. 4, 1993

[30] Foreign Application Priority Data

Feb. 18, 1992 [KR] Rep. of Korea .......................... 92-2369
Feb. 19, 1992 [KR] Rep. of Korea .......................... 92-2441

[51] Int. Cl.⁶ ............................................... B23K 3/08
[52] U.S. Cl. .................................. 228/180.21; 228/49.1; 228/212; 361/718
[58] Field of Search ........................ 228/180.2, 212, 228/49.1, 180.22, 180.21; 29/739; 361/388

[56] References Cited

U.S. PATENT DOCUMENTS

| | | | |
|---|---|---|---|
| 3,305,705 | 2/1967 | Tillmanns et al. | 361/388 |
| 3,793,720 | 2/1974 | Van Rijsewijk et al. | 129/739 |
| 4,638,404 | 1/1987 | Grossmann et al. | 361/388 |
| 4,953,283 | 9/1990 | Kawabata et al. | 29/593 |
| 4,983,533 | 1/1991 | Go | 361/388 |
| 5,169,347 | 12/1992 | Sang | 29/739 |
| 5,208,733 | 5/1993 | Besanger | 361/388 |

*Primary Examiner*—Kenneth J. Ramsey
*Attorney, Agent, or Firm*—Cushman Darby & Cushman

[57] ABSTRACT

A method and apparatus for vertically mounting a semiconductor package is disclosed. The mounting apparatus has an extended (e.g. rectangular) shape, and is provided with a plurality of spaces adapted to receive and hold vertically semiconductor packages. To mount a semiconductor package in such a manner, the package is first inserted into a space in the apparatus provided therefor and fixedly held there. Next, a plurality of such semiconductor packages which are so held by the mounting apparatus are positioned on a printed circuit board, and their leads are soldered thereto to complete the mounting process. This facilitates both surface mounting and multi-layer wiring and decreases the potential for poor quality soldering. In addition, the mounting apparatus according to the present invention is beneficially heat dissipative, which helps to increase the life of a semiconductor package by heat which can cause deleterious thermal stresses.

7 Claims, 2 Drawing Sheets

SEMICONDUCTOR PACKAGE VERTICAL MOUNTING DEVICE AND MOUNTING METHOD

BACKGROUND OF THE INVENTION

1. Field of the Invention

The present invention relates to a method and apparatus for vertically mounting a semiconductor package, and more particularly, to a method and apparatus for vertically mounting a semiconductor package having a single line arrangement of leads precisely and firmly mounted on a printed circuit board.

2. Description of Prior Art

Recent technology trends have lead to the development of vertical surface mounting of Single In-line Package ("SIP") type and Zig-zag In-line Package ("ZIP") type packages on printed circuit boards.

FIGS. 1A and 1B show a conventional apparatus for vertically mounting a semiconductor package, suggested by Texas Instruments, Inc. In such an apparatus, protrusions 1 support semiconductor packages at their ends. Holes in printed circuit board 3 receive and hold the protrusions 1. However, it is disadvantageously difficult to perform surface mounting or multi-layer wiring on such a board. Production costs of the conventionally-made board are higher because the printed circuit board must be punched. Lastly, it is difficult to inspect soldered parts because the packages completely hide leads 2 from view.

FIGS. 2A and 2B show another apparatus for vertically mounting conventional semiconductor packages, suggested by Fujitsu Co. (Japan). In this apparatus, outer leads 12 (that are longer than the main leads) support the packages when soldered on printed circuit board 13. However, this apparatus has a disadvantage in that mechanical vibration reduces the quality of the soldering due to unstable mounting of the package.

SUMMARY OF THE INVENTION

It is therefore an object of the present invention to provide an apparatus for vertically mounting semiconductor package(s) to achieve stable, high-density vertical mounting with a minimum of work.

It is another object of the present invention to provide an apparatus which dissipates heat from the semiconductor package, thereby extending the life of the semiconductor package.

These and other objects and benefits may be realized by the present invention, namely, an apparatus for vertically mounting semiconductor packages having a plurality of spaces for receiving and holding the semiconductor packages in a vertical orientation.

The present invention may combine a horizontal body having spaces for receiving and holding semiconductor packages in a vertical orientation and supporting structures underneath the ends as seen in FIGS. 3 and 4. Thus, the horizontal portion and the supporting structures together form a inverted-"U" shape. Alternately, the mounting apparatus may be provided with integral leg portions as seen in part in FIG. 5 and in FIG. 6.

A method for vertically mounting semiconductor packages according the present invention comprises the steps of inserting semiconductor packages into the spaces of the mounting apparatus with the leads facing towards a printed circuit board. The leads are then soldered onto the circuit board. Depending on the chosen structure of the mounting apparatus as described above, supporting structures for supporting the mounting apparatus may be provided underneath ends of the mounting apparatus.

The objects and the features of the present invention will become more apparent from the following description with reference to the accompanying drawings, which together are meant to be illustrative by way of example, and not limiting on the scope of the disclosure.

DETAILED DESCRIPTION OF THE PREFERRED EMBODIMENT

The preferred embodiments of the present invention will be described in detail with reference to the drawings appended hereto.

Figure 1A:
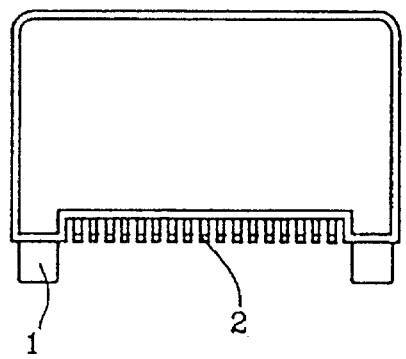
FIG. 1A shows a conventionally-known apparatus for vertically mounting a semiconductor package.
Figure 1B:
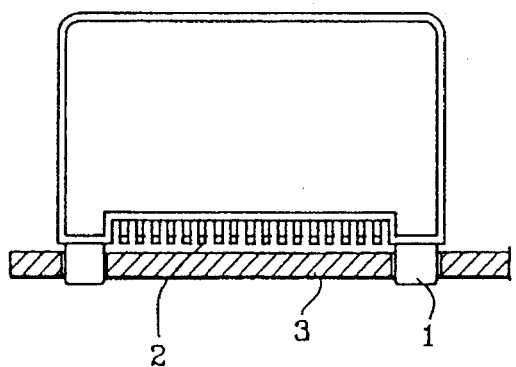
FIG. 1B is a side view illustrating the semiconductor package of FIG. 1A mounted on a printed circuit board.
Figure 2A:
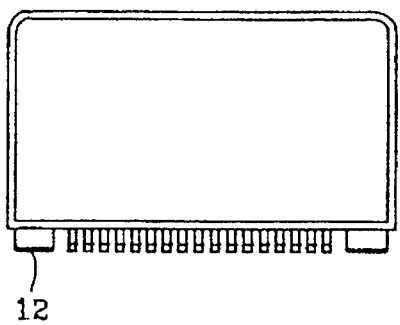
FIG. 2A shows a different type of conventionally-known apparatus for vertically mounting a semiconductor package.
Figure 2B:
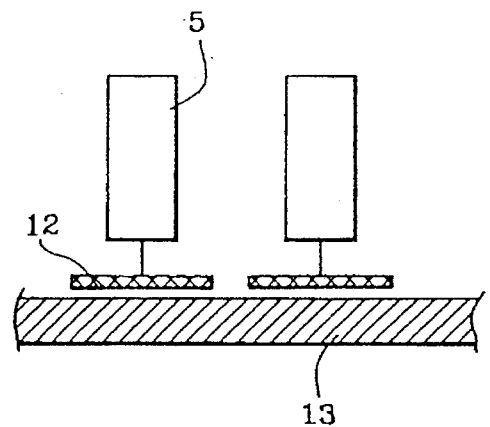
FIG. 2B is a side view illustrating the semiconductor package of FIG. 2A mounted on a printed circuit board.
Figure 3:
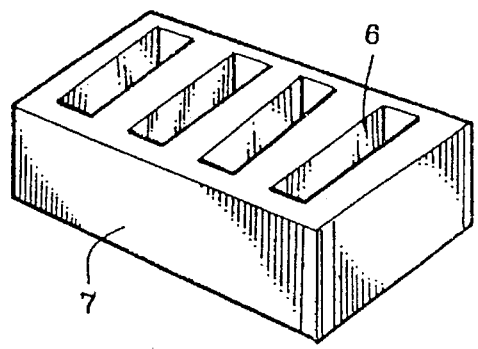
FIG. 3 shows an apparatus for vertically mounting a semiconductor package according to the present invention.
Figure 4:
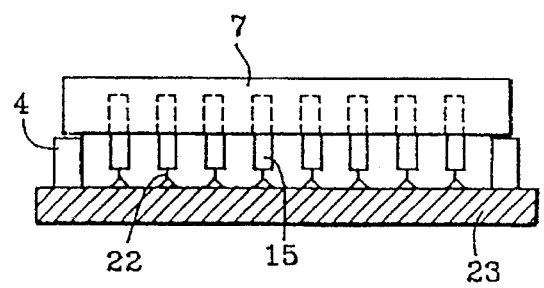
FIG. 4 is a side view representing a plurality of vertically mounted semiconductor packages on a printed circuit board with the apparatus in FIG. 3.

In FIGS. 3 and 4, mounting apparatus 7 has spaces 6 for receiving and holding semiconductor packages 15 in a substantially vertical orientation. The dimensions of the spaces 6 may be changed depending on the type of packages to be held. A plurality of appropriately-sized semiconductor packages can be held in a single space 6 in parallel or serial connection. The spaces 6 are shown as spaced at constant intervals, but they can be arranged at different intervals according to operational requirements.

Semiconductor packages 15 are inserted into spaces 6 of mounting apparatus 7, such that the electrical leads 22 of the semiconductor packages are extending upwards. The semiconductor packages 15 may be held in place by a suitable adhesive, such as epoxy. The mounting apparatus 7 is inverted and positioned on a printed circuit board 23, as shown in FIG. 4. The adhesive is preferably strong enough to prevent the semiconductor packages 15 from shifting under their own weight. If the mounting apparatus 7 weighs too heavily on semiconductor packages 15, then separate supporting structures 4 made of the same material as the mounting apparatus 7 may be provided underneath the ends of mounting apparatus 7 as seen in FIG. 4.

After the mounting apparatus 7 (with semiconductor packages 15) is suitably positioned on printed circuit board 23, the leads 22 of the semiconductor packages 15 are soldered on the circuit board 23. If desired, the mounting apparatus 7 can be removed (if packages 15 have not been fixed by adhesive) after the soldering step is performed.

Figure 5:
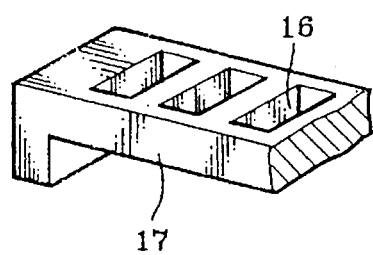
FIG. 5 is a partial view of another type of apparatus for vertically mounting a semiconductor package according to the present invention.
Figure 6:
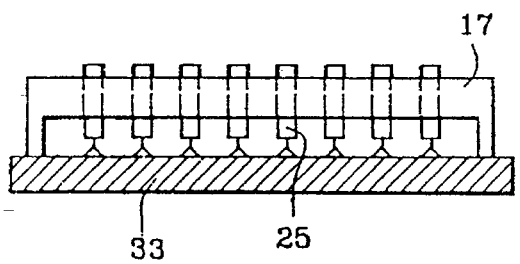
FIG. 6 is a side view representing a plurality of semiconductor packages which are vertically mounted on a printed circuit board with the apparatus in FIG. 5.

Another embodiment of the present invention can be seen in FIGS. 5 and 6. The generally inverted "U"-shaped mounting apparatus 17 is used to mount a plurality of semiconductor packages 25 of arbitrary weight. The upper portions of semiconductor packages 25 protrude from the upper surface of the mounting apparatus 17, as seen in FIG. 6. The mounting apparatus 17 has vertical leg portions for stability when fixed on printed circuit board 33. In this embodiment, semiconductor packages 25 are inserted into spaces 16 after mounting apparatus 17 is suitably positioned on printed circuit board 33. This is in contrast to the previously described embodiment in which packages are placed in the apparatus before positioning on the circuit board.

Thus, the present invention advantageously provides an apparatus for stable, vertical mounting of semiconductor packages on a printed circuit board, without punching holes through the printed circuit board. This allows both surface mounting or multi-layer wiring and also reduces production costs. Furthermore, soldered parts can be easily inspected after manufacture, and low quality soldering due to vibrations during the soldering process can be reduced. Lastly, the mounting apparatus dissipates heat, which extends the life of the semiconductor packages by reducing thermal stress thereon.

The present invention is in no way limited to the embodiments described above. Various modifications of the present invention will become apparent to persons skilled in the art after referring to the description of the invention.

What is claimed is:

1. An apparatus for vertically mounting a plurality of semiconductor components inserted therein, each having electrical leads extending therefrom to a circuit board comprising:

an extended body made from a heat dissipative material, said body having a plurality of spaces, each said space conforming generally to one of the semiconductor components, said spaces positioned and oriented within the extended body to hold said respective semiconductor components with leads exposed and in a vertical mounting orientation relative to the circuit board such that said leads extend in a direction parallel to a semiconductor component insertion direction;

said body further comprising leg protrusions displacing the extended body from the circuit board.

2. An apparatus for vertically mounting a plurality of semiconductor components inserted therein, each having electrical leads extending therefrom to a circuit board comprising:

an extended body made from a heat dissipative material, said body having a plurality of spaces, each said space conforming generally to one of the semiconductor components, said spaces positioned and oriented within the extended body to hold said respective semiconductor components with leads exposed and in a vertical mounting orientation relative to the circuit board such that said leads extend in a direction parallel to a semiconductor component insertion direction;

said body being provided with support means disposed under opposing ends of said body to form a generally U-shaped structure.

3. An apparatus according to claim 2, wherein said support means are separately formed from said extended body.

4. A method for vertically mounting a plurality of semiconductor components having electrical leads on a circuit board comprising the steps of:

(a) inserting a semiconductor component into a respective space formed in a mounting body in an orientation wherein said electrical leads extend in a direction parallel to a semiconductor component insertion direction;

(b) positioning said mounting apparatus, with said semiconductor components in a mounting orientation on a printed circuit board; and (c) electrically connecting the electrical leads to the printed circuit board.

5. An semiconductor component assembly comprising:

a plurality of semiconductor components having electrical leads extending therefrom; and a mounting apparatus having a body with a plurality of spaces, each space conforming generally to a respective semiconductor component inserted therein, said spaces oriented to hold the semiconductor components with leads exposed in a predetermined mounting orientation with said electrical leads extending in a direction parallel to a semiconductor insertion direction.

6. An assembly as in claim 5 further comprising a circuit board, wherein the spaces of the mounting apparatus orient the electronic component leads in mounting orientation relative to the circuit board.

7. A method for vertically mounting a plurality of semiconductor components having electrical leads on a circuit board comprising the steps of:

(a) inserting a semiconductor component into a respective space formed in a mounting body in an orientation wherein said electrical leads extend in a direction parallel to a semiconductor component insertion direction;

(b) positioning said mounting apparatus, with said semiconductor components in a mounting orientation on a printed circuit board;

(c) electrically connecting the electrical leads to the printed circuit board; and (d) positioning a support structure beneath opposing ends of said mounting apparatus, said support structure bearing the weight of the mounting apparatus.

* * * * *